United States Patent
Mitra et al.

(10) Patent No.: US 9,214,583 B2
(45) Date of Patent: Dec. 15, 2015

(54) METHOD TO BUILD TRANSPARENT POLARIZING SOLAR CELL

(76) Inventors: Hirak Mitra, Santa Clara, CA (US);
Karen Ann Reinhardt, San Jose, CA (US)

(\*) Notice: Subject to any disclaimer, the term of this patent is extended or adjusted under 35 U.S.C. 154(b) by 0 days.

(21) Appl. No.: 13/049,852

(22) Filed: Mar. 16, 2011

(65) Prior Publication Data
US 2012/0070934 A1    Mar. 22, 2012

Related U.S. Application Data

(60) Provisional application No. 61/315,396, filed on Mar. 19, 2011.

(51) Int. Cl.
H01L 31/068    (2012.01)
H01L 31/0352   (2006.01)
H01L 31/05     (2014.01)

(52) U.S. Cl.
CPC .... *H01L 31/035281* (2013.01); *H01L 31/0508* (2013.01); *H01L 31/0512* (2013.01); *Y02E 10/50* (2013.01)

(58) Field of Classification Search
CPC .................................................. H01L 31/042
USPC ..................................... 438/69, 87; 136/261
See application file for complete search history.

(56) References Cited

U.S. PATENT DOCUMENTS

| | | | | |
|---|---|---|---|---|
| 5,254,179 A * | 10/1993 | Ricaud et al. | ............... | 136/244 |
| 6,133,570 A * | 10/2000 | Schimert et al. | ............ | 250/338.1 |
| 6,180,871 B1 * | 1/2001 | Campbell et al. | ............. | 136/258 |
| 7,098,395 B2 * | 8/2006 | Hiraishi et al. | ............... | 136/251 |
| 7,554,031 B2 * | 6/2009 | Swanson et al. | .............. | 136/261 |
| 7,951,725 B2 * | 5/2011 | Lu et al. | ....................... | 438/753 |
| 7,961,393 B2 * | 6/2011 | Perkins et al. | ........... | 359/485.05 |
| 8,449,782 B2 * | 5/2013 | Lim et al. | ........................ | 216/24 |
| 2010/0282952 A1 * | 11/2010 | Estevez | ........................ | 250/225 |
| 2011/0023958 A1 * | 2/2011 | Masson et al. | ................ | 136/256 |
| 2011/0203660 A1 * | 8/2011 | Campbell et al. | ............. | 136/258 |
| 2012/0292675 A1 * | 11/2012 | Roizin et al. | ................... | 257/290 |

OTHER PUBLICATIONS

Pelletier ("Aluminum nanowire polarizing grids: Fabrication and analysis." Applied Physics Letters 88, 211114 (2006)).*
Hirose, K.; Mita,Y.; Sakai, S., "Polarization-Transmissive Thin-Film Solar Cell with Photodiode Nanowires," Optical MEMS and Nanophotonics, 2007 IEEE/LEOS International Conference on , vol., no., pp. 29,30, Aug. 12, 2007-Jul. 16, 2007.*

\* cited by examiner

*Primary Examiner* — Cheung Lee
*Assistant Examiner* — Stephen Bradley

(57) ABSTRACT

The present disclosure provides a means to build a solar cell that is transparent to and polarizes visible light, and to transfer the energy thus generated to electrical power wires.

4 Claims, 6 Drawing Sheets

METHOD TO BUILD TRANSPARENT POLARIZING SOLAR CELL

The present invention is a continuation of provisional patent 61/315,396.

FIELD OF THE INVENTION

The present invention relates to apparatuses and methods to produce solar cells.

BACKGROUND OF THE INVENTION

Solar cell, also known as photovoltaic cell, technology is increasingly useful as energy costs and people seek environmentally friendly "green" ways to generate power. However, current solar cells are opaque, limiting their use in commercial and residential building to rooftop installation with no functionality other than creating energy. This precludes their use in a variety of applications that require transparency. In particular if solar cells were transparent they would be useful as windows. Since glass windows are a common feature to many building, both commercial and residue, windows that can be made both to generate energy and to allow illumination into the building are beneficial. Windows are extremely common and are found on all types of building; homes, apartments, office, and other institutions; both vertically installed and horizontally, such in skylights. Additionally, dual uses as a polarized and solar window would be useful for shading, darkening, and for energy generation.

Until this invention, no other patent has disclosed the ability to provide solar power with a transparent and viewing window for energy generation.

The usefulness of using windows for solar cell has been a goal for many researchers. Solar windows have been disclosed that integrate solar cells in the window itself, in a decorative pattern or as a replacement for glass panels. U.S. Pat. No. 4,137,098 discloses an array of solar cells in a Venetian blind configuration which can be opened or closed to let in light. U.S. Pat. No. 5,128,181 discloses a combination of solar cell and solar heating panel integrated together. U.S. Pat. No. 6,646,196 discloses a simple arrangement of window panes and a solar cell panel installed in a frame that can be placed in a window opening, the same panel that can be installed on roof-tops. All these inventions integrated silicon wafer solar cell technology arranged to create windows, but the solar cell is not the window itself. Limitations arise as to the amount of light that can be allowed into the room where the window is.

U.S. Pat. No. 6,688,053 shows a double paned, solar power window that encloses solar cells and dichromatic mirrors between the two panes, thus using the reflected light to generate electricity. This patent combines three functions into one, relying on integration of these components. The light directed to the solar cells relies on dichromatic mirrors to direct all wavelengths of light to mirror. The cells are arranged in a manner to allow light into the building while also generating electricity. A converter is required to transform DC to AC. The physical dimensions are not disclosed, but the thickness of the window is assumed to be of the order of an inch and may be limited for residential applications. Also, the integration is quite costly and required three separate components. Also of limitation is the light allowed into the room.

U.S. Pat. No. 7,019,207 discloses a thin film solar panel that could be used for window applications, the etched transparent lines act as Venetian blinds allowing light to enter a room, providing partical shade. However, the blinds cannot be modulated, they are permanent fixtures. Because patterns can be etched into the thin film windows were shading is required or a decorative façade can be fabricated. Limitation of this application is the light that is allowed into the room.

SUMMARY

In an embodiment the present invention discloses a method to build a "solar window", a device that is transparent, lets in light for illumination, and allows viewing of the surrounding area, but still generates electricity from light. The solar window, as exemplified in [FIG. 1], is a device that comprises parallel strips of:
1. Optically opaque photovoltaically active material
2. Optically opaque "wire", i.e. electrically conductive material
3. Optically transparent material.

These strips have characteristic widths similar to one quarter of the wavelengths of visible light. The strips may have all the same width, or may have different widths. The strips are not visible with the naked eye, and thus do not impede the view through the transparent glass substrate.

The percentage of the total width of the whole solar window that is photovoltaic active material is linearly proportional to how much power the solar window generates.

The percentage of the total width of the solar window that is wire is linearly proportional to the maximum current the solar window can generate, and thus limits the maximum power the solar window will generate in practice.

The percentage of the total width of the whole solar window that is transparent linearly determines how much visible light can cross it, and thus how "dark" it is.

That the transparent parts of the solar window are parallel and approximately the wavelength of visible light which causes the solar window to be a polarizing grid, i.e. transparent to the naked human eye. Also this arrangement causes the photovoltaic cell to polarize light, like polarizing sun glasses. Simultaneously the solar window generates electrical power when exposed to light.

In an embodiment the solar window may have a transparent coating to protect the photosensitive materials.

In another embodiment, the solar panel is a frameless unit that want be placed into a window opening, which is framed.

In one embodiment, the solar panel and is connect to the power supply through external wiring.

If the windows of a building consist of solar windows then those windows become solar photovoltaic cells, thus generating electrical power during daylight hours. Moreover such windows are polarized, thus blocking glare from the sun. Those windows also are transparent and allow a view of the surrounding area.

To integrate the windows into the grid or power supply generation for the building successfully power generated from the window must be conductor to the point use, through the supply line. The distribution box is typically placed close to the panels. However, the need for embedding the windows directly into the building circumvents this arrangement. Thus, the inverter can be installed in the wall between joists, and conducted to any part of the house through conventional wiring. Windows can be wired in series and can be grounded, and surge protectors added as needed.

U.S. Pat. No. 6,750,391 discloses an elegant solution for windows that needs only simple wiring from each window to the inverter and supporting electronics that could also be used. This arrangement would be very practical for a residential dwelling or small commercial building. On a larger scale, series of these modules could be employed.

Alternate wiring and generation schemes are possible with the same result. For instance a local battery for storing energy for use at night. How this power is stored is outside of the scope of this invention.

The edge of the N-layer and the P-layer is a photovoltaically active N-P diode juncture (12). Light (13) hitting this region causes an electrical current consisting of electrons and holes. These are carried away by the vias (8, 9) into the metal wires (10, 11). Light (13) hitting these metal wires reflects away, while light (14) hitting the undoped silicon passes through.

Figure 1:
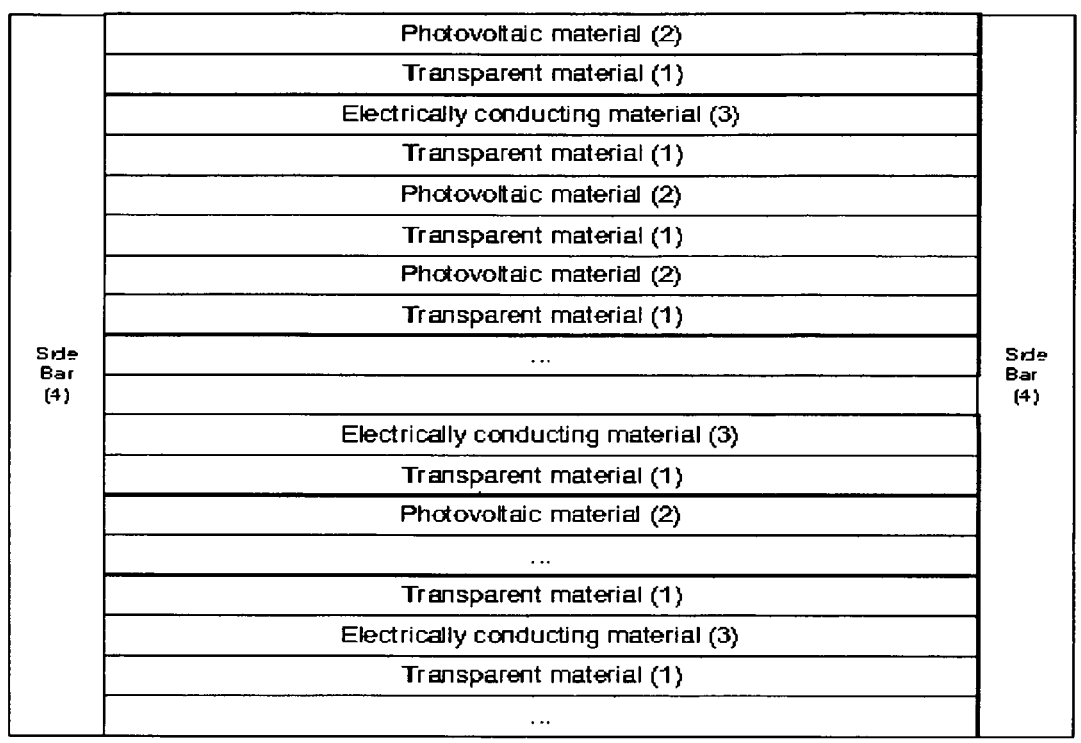
FIG. 1 shows an exemplar of the solar window. The transparent material (1), photovoltaic material (2) and electrically conducting material aka wire (3) are all in parallel strips. At the edges of the solar window, perpendicular to these strips, are the side bars. These contain circuitry to accumulate and to use the current generated in (2) and carried in (3).
Figure 2:
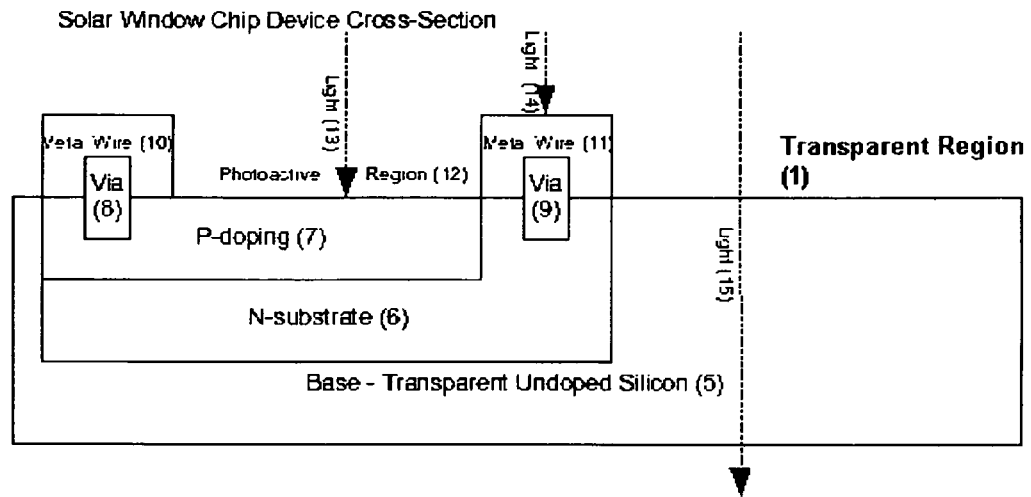
FIG. 2 shows a cross section of a photovoltaic device on a solar window implemented as a chip. It is not drawn to scale. The substrate may be any quality of glass; inexpensive transparent borosilicate glass is one option. The base (5) consists of transparent undoped silicon. N-type silicon (6) is doped into this, and P-type silicon (7) is deposited onto the N-type layer. The thickness of these layers are such that they are transparent to visible light. The undoped and doped silicon can be deposited by a variety of means such as LPCVD (low pressure chemical vapor deposition), PECVD (plasma enhanced chemical vapor deposition), ALD (atomic layer deposition), sputtering, or other similar processes.
Figure 3:
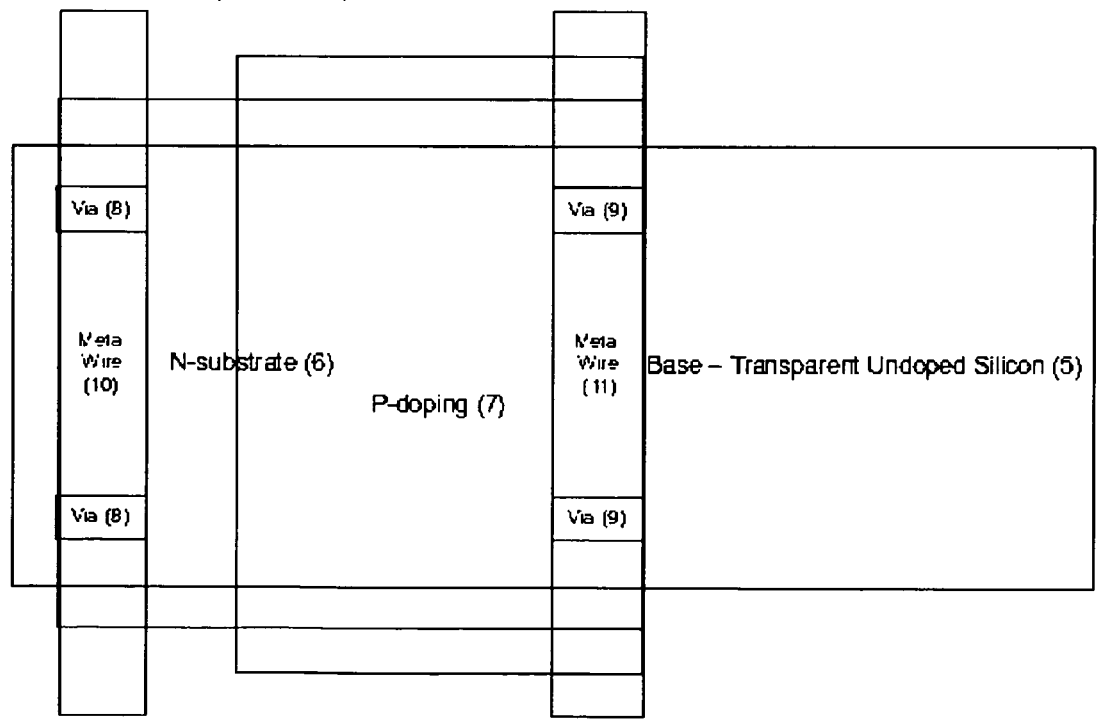

FIG. 3 shows a top view of the same device as in FIG. 2.

Figure 4:
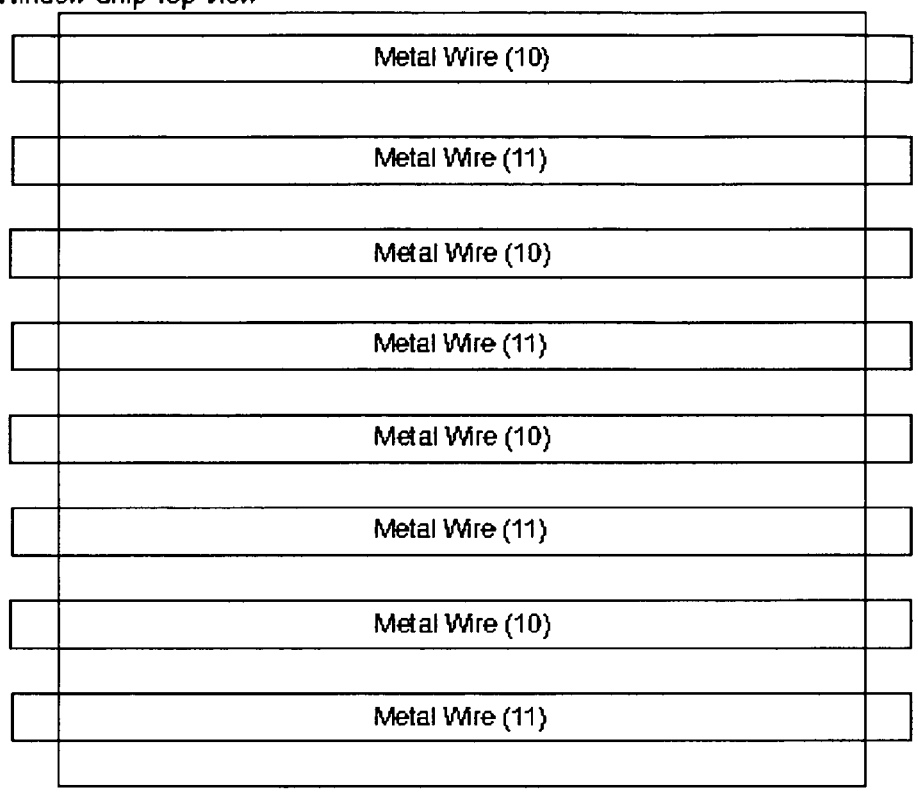

FIG. 4 shows the how the metal wires (10, 11) in FIG. 2 and FIG. 3 traverse a solar window implemented as a chip.

Figure 5:
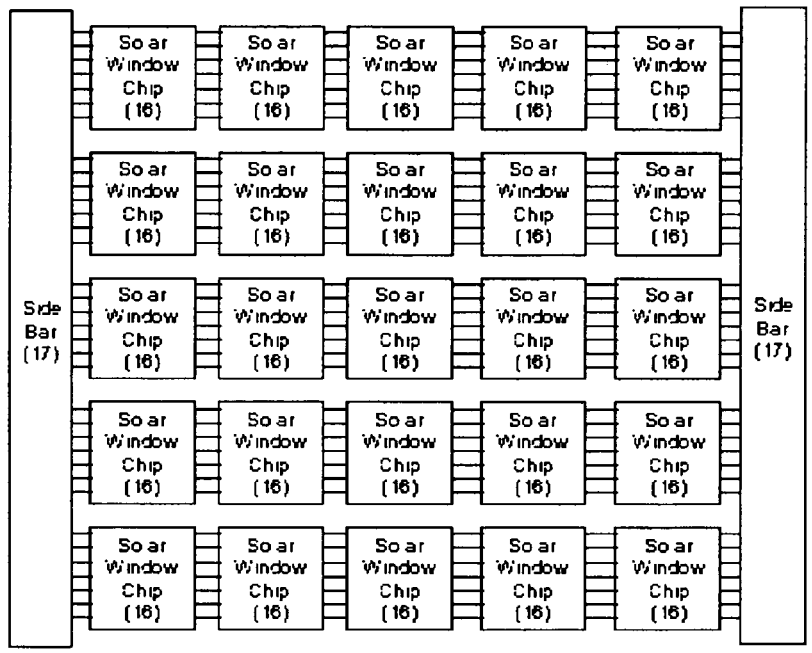

FIG. 5 shows how an array of solar window chips (16) may be placed on a glass backplane so that their metal wires line up. It is not drawn to scale.

Figure 6:
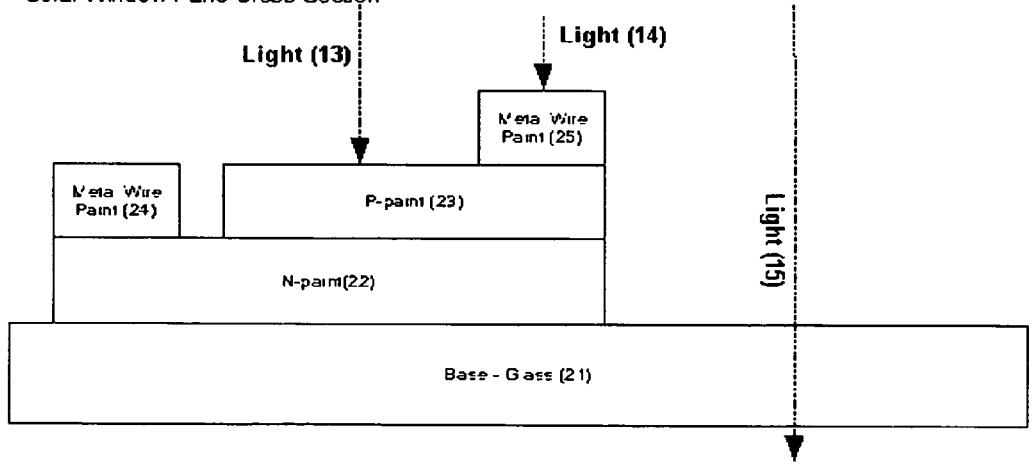

FIG. 6 shows a cross section of a part of a solar window implemented on a sheet of glass. Visible light traverses the transparent glass base (21). Stripes of N-paint (22), P-paint (23) and metal wire paint (24 and 25) are all painted onto this glass base, in layers. 22, 23, 24 and 25 obstruct light.

Figure 7:
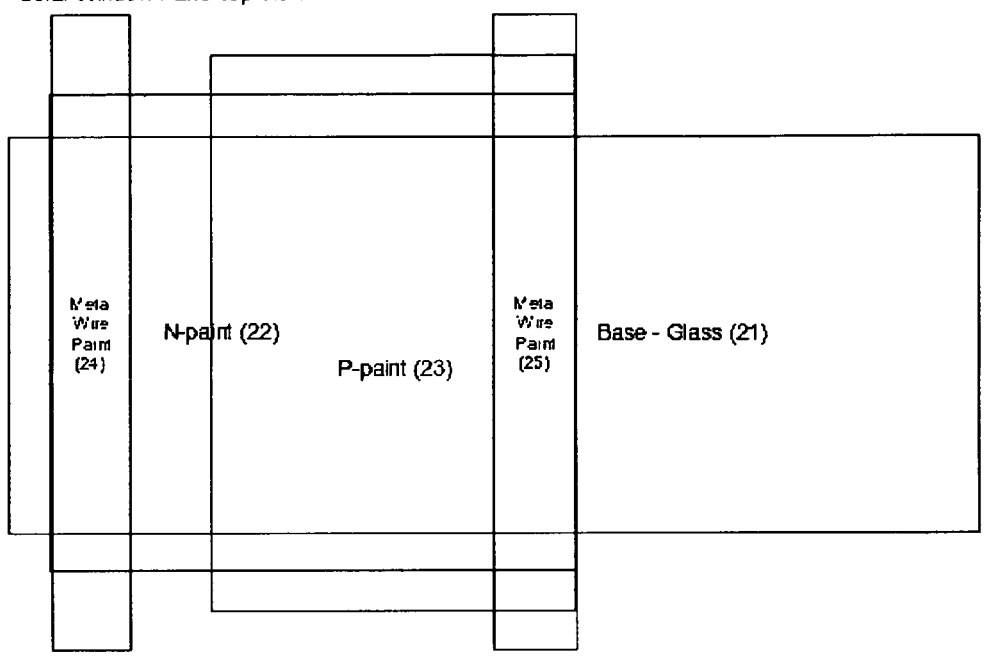

FIG. 7 shows the top view of a solar window implemented on a sheet of glass. The devices here are the same as in FIG. 6.

Figure 8:
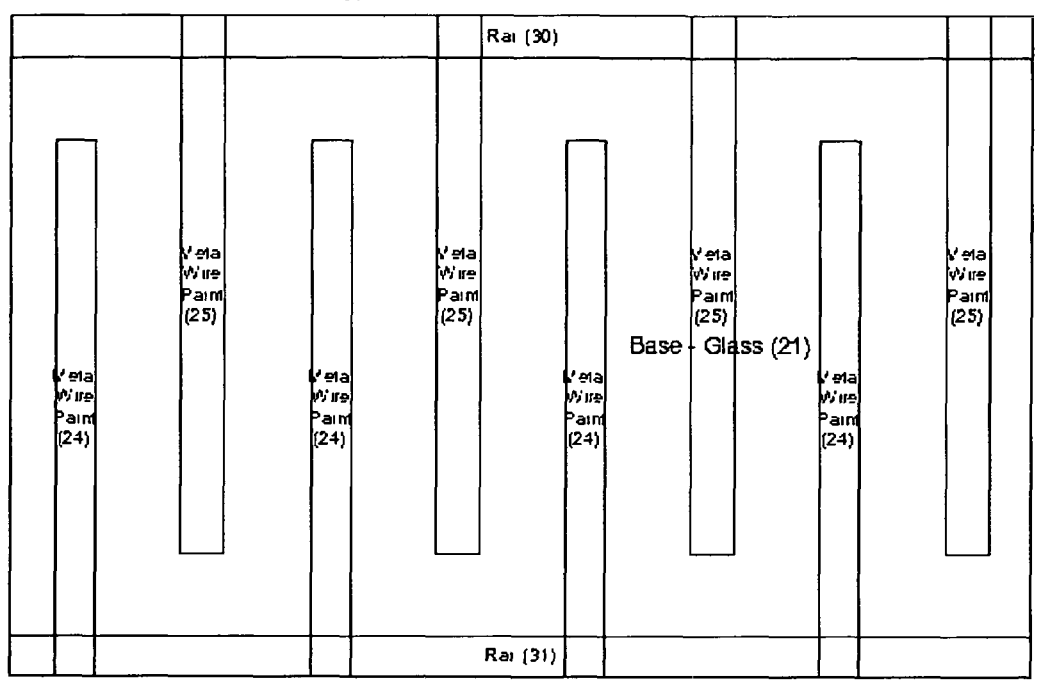

FIG. 8 shows an example of the solar window implemented on a sheet of glass, but only the glass (21), metal wire paint (24 and 25) and rails. One rail (31) connects to metal wire paint (24) that connects to the N-paint, and the other rail (30) connects to the metal wire paint (25) that connects to the P-paint.

DETAILED DESCRIPTION OF THE PREFERRED EMBODIMENTS

First Preferred Embodiment

In an aspect this invention is the Solar Window chip or "SW chip", an integrated circuit [FIG. 2]. The SW chips are glued to a backplane of transparent glass to give the structure rigidity. Adjacent SW chips on the backplane abut so that their photovoltaic regions join, and their wires join, as shown in FIG. 5.

As shown in FIG. 4 each solar window chip has metal wires (10, 11) traversing it. Metal wires (10) connect through vias (8) to P-doping (7). Metal wires (11) connect through vias (9) to N-substrate (6). When light (13) strikes the Photoactive Region (12) where P-doping overlays N-substrate it causes electrical current to go through the vias (8, 9) and the metal wires (10, 11) out of the device. Light (14) striking the metal wires (12, 13) reflects away or is absorbed, while light (15) striking the undoped silicon base (5) passes through and becomes polarized.

Second Preferred Embodiment

In an aspect this invention is the Solar Window pane or "SW pane". An SW pane consists of a sheet of transparent glass. Photovoltaically active regions and wires are "painted", i.e. deposited in some fashion, onto this glass, as in FIG. 6, FIG. 7 and FIG. 8. As shown in FIG. 8 the glass (21) is painted to be a particular size. The edges of the glass have metal paint rails that conduct the electricity generated away from the window. The metal wire paint connecting to the P regions (25) all connect to one rail (24) while the metal wire paint connecting to the N regions (24) all connect to another rail (31). These rails conduct electricity away from the solar window.

FIG. 7 shows that the one painted metal wire (24) connects to the N-paint (22) which defines the painted N region, while another painted metal wire (25) connects to the P-paint (23) which defines the painted P region.

FIG. 6 shows a cross-section of one device of a solar window pant. Here the base glass (21) has N-painted painted onto it (22), which defines the N region. P-paint (23) is painted over the N-paint, creating a photoactive region. Not abutting the P-paint (23) is a painted metal wire (24) which conducts electricity away from the N-paint (22). Over the P-paint (23) is a painted metal wire (25) which conducts electricity away from the P-paint (25).

Third Preferred Embodiment

In an aspect this invention is Solar Window sheet, or "SW sheet". It comprises a sheet of transparent plastic. Wires and photovoltaically active regions are "painted", i.e. deposited in some fashion, onto this plastic. Apart from the fact the underlying base is plastic instead of glass and thus may be flexible, this preferred embodiment is identical to the previous one.

REFERENCES

1) *Fabrication of a 50 nm half-pitch wire grid polarizer using nanoimprint lithography*
Seh-Won Ahn, Ki-Dong Lee, Jin-Sung Kim, Sang Hoon Kim, Joo-Do Park, Sarng-Hoon Lee and Phil-Won Yoon (E-mail kdlee@lge.com)
Devices and Materials Laboratory, LG Electronics Institute of Technology, 16 Woomyeon-Dong, Seocho-Gu, Seoul 137-724, Republic of Korea
Journal Nanotechnology Volume 16, Number 9 Page 1874
doi: 10.1088/0957-4484/16/9/076

We report the fabrication of a 50 nm half-pitch wire grid polarizer with high performance using nanoimprint lithography. The device is a form of aluminium gratings on a glass substrate whose size of 5.5 cm×5.5 cm is compatible with a microdisplay panel. A stamp with a pitch of 100 nm was fabricated on a silicon substrate using laser interference lithography and sidewall patterning. The imprint and the aluminium etching processes are optimized to realize uniform aluminium gratings with aspect ratio of 4. The polarization extinction ratio of the fabricated device is over 2000, with transmission of 85% at a wavelength of 450 nm, which is the highest value ever reported. This work demonstrates that nanoimprint lithography is a unique cost-effective solution for nanopatterning requirements in consumer electronics components 2) *Polarized Luminescence from Single Polymer Nanowires and Aligned Nanowire Arrays*
Deirdre O'Carroll, Alan O'Riordan, Gareth Redmond
MRS Proceedings Volume 948E p. B09-04

The synthesis of poly(9,9-dioctylfluorene) conjugated polymer nanowires using the method of solution assisted wetting of nanoporous alumina membrane templates is reported. Polymer nanowires (approx. 10^9 per template) with a diameter of approx. 200 nm are obtained. Photoluminescence from isolated nanowires fluidically-aligned at glass substrates is found to be dominated by emission from the planar beta-phase of the polymer. The wires also exhibit polarized light emission suggestive of axial alignment of beta-phase segments within the nanowires. Dense arrays of aligned nanowires exhibiting anisotropic emission are also demonstrated.

3) *Silver nanowire array infrared polarizers*
Author Y T Pang 1, G W Meng, Q Fang and L D Zhang
E-mailytpang@263.net AffiliationsInstitute of Solid State Physics, Chinese Academy of Sciences, PO Box 1129, Hefei 230031, Peoples' Republic of China
JournalNanotechnology
Volume 14, Number 1 Page 20
doi: 10.1088/0957-4484/14/1/305

A silver nanowire array micropolarizer within an anodic alumina membrane (AAM) was fabricated by anodization of pure Al foil and electrodeposition of Ag, respectively. X-ray diffraction, scanning electron microscopy, and transmission electron microscopy investigations reveal that the nanowires are essentially single crystals, and have an average diameter of 90 nm. Spectrophotometer measurements show that the silver nanowire arrays embedded in the AAM can only transmit vertically polarized light to the wires. An extinction ratio of 25-26 dB and average insertion loss of 0.77 dB in the wavelength range 1-2.2 μm were obtained, respectively. Therefore the Ag nanowire/AAM can be used as a wire-grid type polarizer 4) C. Xiang, S. C. Kung, D. K. Taggart, F. Yang, M. A. Thompson, Garcia Güell, Y. Yang, R. M. Penner*, *Lithographically Patterned Nanowire Electrodeposition: A Method for Patterning Electrically Continuous Metal Nanowires on Dielectrics*, ACS Nano 2 (2008) 1939.

We describe the electrochemical deposition of lead selenide (PbSe) nanowire arrays by the lithographically patterned nanowire electrodeposition (LPNE) method. The nanowires were electrodeposited using a constant potential method from an aqueous solution containing $Pb^{2+}$ and $HSeO_3^-$ at room temperature onto an electrode that had been photopatterned in unfiltered laboratory air. The resulting polycrystalline nanowires were stoichometric, face-centered cubic PbSe and had a rectangular cross section with lengths >1 mm, widths between 80 and 600 nm, and heights between 40 and 80 nm. The synthesized nanowires were characterized by scanning electron microscopy (SEM), energy dispersive X-ray fluorescence (EDX), transmission electron microscopy (TEM), selected area electron diffraction (SAED), and powder X-ray diffraction (XRD). The electrical resistivity of the nanowires is comparable to that of other PbSe nanowires.

We claim:

1. An array of solar window regions, wherein a solar window region is a photovoltaic diode which also polarizes light, said solar window region comprising:
   a transparent substrate comprising a material selected from the group consisting of glass, quartz, silicon crystal and organic material;
   thin film doped layers and electrically conducting material, wherein the thin film doped layers create p-n junctions; wherein
   the thin film doped layers and the electrically conducting material are arranged such that from a viewpoint perpendicular to the surface of the photovoltaic diode they appear in parallel strips, with portions of the transparent substrate also appearing in parallel strips between said thin film doped layers and said electrically conducting material;
   the thin film doped layers absorb incident light, thereby generating electricity;
   said transparent substrate is transparent to light incident upon it;
   the parallel strips of thin films doped layers are of equal width;
   the parallel strips of transparent substrate are of equal width;
   said strips of thin film doped layers and said strips of transparent substrate are arranged in an alternating pattern between a first edge of the photovoltaic diode and a first strip of electrically conducting material, in between sequential strips of electrically conducting material, and between a final strip of electrically conducting material and an opposite edge of the photovoltaic diode;
   said strips of thin film doped layers and said strips of transparent substrate are between 0 nm and 200 nm wide;
   said strips of transparent substrate, said thin film doped regions, and said strips of electrically conducting material being arranged geometrically so that said window polarizes the light which passes through it;
   thereby resulting in a device which generates electricity and appears transparent to a person looking through it by allowing light to pass through, but which polarizes said light.

2. The photovoltaic diode of claim 1, wherein the total width of the strips of transparent substrate is N nm and the total width of the strips of thin film doped layer and strips of electrically conductive material is M nm, thereby causing N/(M+N) part of visible light falling on said photovoltaic diode to pass through and the other M/(M+N) part of said visible light to fall on thin film doped layers and electrically conductive material, converting said visible light either to electricity or to waste heat.

3. The photovoltaic diode of claim 1 wherein said electrically conductive material are made from materials drawn from the set of nanowires, nanotubes, metal paint and molecular imprint, thereby producing nanometer-length wiring.

4. The photovoltaic diode of claim 1 where said thin film is made from materials drawn from the set of SiO2, TCO, CdTe, and poly-silicon.

* * * * *